(12) United States Patent
Kurosaki

(10) Patent No.: US 6,385,112 B1
(45) Date of Patent: May 7, 2002

(54) NONVOLATILE SEMICONDUCTOR MEMORY DEVICE WITH RELIABLE VERIFY OPERATION

(75) Inventor: Kazuhide Kurosaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/810,498

(22) Filed: Mar. 19, 2001

(30) Foreign Application Priority Data

Oct. 30, 2000 (JP) ........................................ 2000-331343

(51) Int. Cl.[7] ................................................. G11C 7/02
(52) U.S. Cl. ..................................... 365/210; 365/185.2
(58) Field of Search ............................ 365/210, 185.22, 365/185.2–185.29, 185.33

(56) References Cited

U.S. PATENT DOCUMENTS

| 5,157,626 A | * | 10/1992 | Watanabe | .................. 365/185 |
| 6,163,484 A | * | 12/2000 | Uekubo | .................. 365/185.2 |
| 6,172,911 B1 | * | 1/2001 | Tanaka | .................. 365/185.22 |

* cited by examiner

*Primary Examiner*—A. Zarabian
(74) *Attorney, Agent, or Firm*—Arent Fox Kintner Plotkin & Kahn, PLLC

(57) ABSTRACT

The present invention provides a dummy cell that provides a dummy programming level and a dummy erasing level which are set such as to give "fail" results during verify operations under ordinary conditions and "pass" results when noises affect verify operations, thereby ascertaining correct programming or erase operation for flash memories.

12 Claims, 6 Drawing Sheets

NONVOLATILE SEMICONDUCTOR MEMORY DEVICE WITH RELIABLE VERIFY OPERATION

BACKGROUND OF THE INVENTION

1. Field of the Invention

The present invention generally relates to semiconductor memory devices and particularly relates to flash memory devices that perform verify operations.

2. Description of the Related Art

In flash memory devices, verify operations are necessary to ascertain that electric charges are properly injected to memory cells by program operations. If the verify operations failed, program operations are repeated until results of verify operations are found successful, that is, "pass". In case of erase operations, verify operations are performed similarly to ascertain proper removal of the electric charges from the memory cells.

Recently, main implementations have been such that a read operation and a program/erase operation are performed simultaneously in flash memories. In such implementations, verify operations are subjected to noise in power supply lines, which is generated by the data read operation, causing erroneous checks. The erroneous checks result from identifying a "fail" state as a "pass" state, for example. That is, a state which should have been determined as "fail" and for which program or erase operations should have been repeated for sufficient charging or discharging, may be erroneously determined as "pass" and the program or erase operations are considered as completed because of the power line noise. In this manner, an erroneous operation may occur during data reading operations.

Accordingly, there is a need for a semiconductor memory device which does not malfunction during the verify operation even if there is a power line noise or the like.

SUMMARY OF THE INVENTION

It is a general object of the present invention to provide a semiconductor memory device that substantially obviates one or more of the problems caused by the limitations and disadvantages of the related art.

A specific object of the present invention is to provide a semiconductor memory device that performs error-free verify operations which have been adversely affected by noise in conventional implementations.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor memory device including:

a memory cell;

a comparator unit that detects whether a first level corresponding to a memory status of the memory cell is set within a predetermined range based on comparison of the first level with a reference level; and a dummy cell that provides a second level which is set to such a level that the comparator unit determines the second level as falling outside the predetermined range when comparing the second level with the reference level.

In the present invention, if the comparator unit determines that the second level is within the predetermined range based on comparison with the reference level, it determines that there is an error.

Further, if the comparator unit determines that the second level is outside the predetermined range and if the first level is within the predetermined range, it determines that the first level is correctly set at a proper range.

In case where the comparator unit detects that the second level is within the predetermined range based on comparison with the reference level and that the first level is set within the predetermined range, it ascertains that the first level is not correctly set within the predetermined range.

As above described, the present invention provides a dummy cell which is set such as to fail in the verify operation under normal conditions, i.e., in the absence of disturbing noise. The voltage of the dummy cell is affected when the voltage of data cells is affected by the noise, which makes the dummy cell voltage pass the verification test, which means that there has been an erroneous determination.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
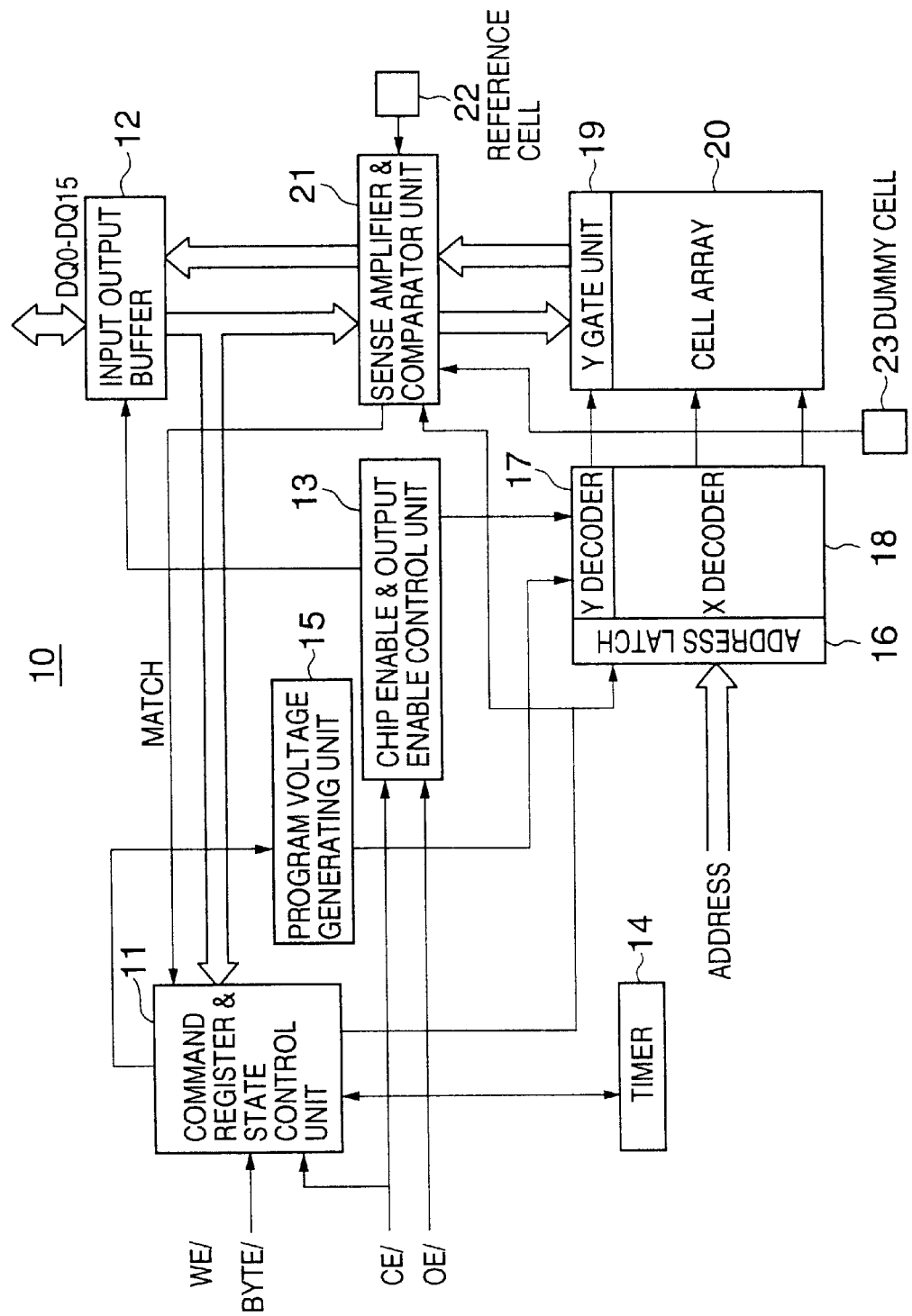
FIG. 1 is a block diagram of the semiconductor memory device to which the present invention is applied.

In FIG. 1, the semiconductor memory device 10 includes a command register & state control unit 11, an input output buffer 12, a chip enable & output enable control unit 13, a timer 14, a program voltage generating unit 15, an address latch 16, a Y decoder 17, an X decoder 18, a Y gate unit 19, a cell array 20, a sense amplifier & comparator unit 21, a reference cell 22 and a dummy cell 23.

The command register & state control unit 11 receives control signals such as a chip enable signal /CE and a write enable signal /WE and commands from outside, and serves as a command register to store the commands. The command register & state control unit 11 further operates as a state machine to control other units of the semiconductor memory device 10, based on the control signals and the commands.

The input output buffer 12 receives data from outside, and provides the data to the sense amplifier & comparator unit 21, then supplying command related data to the command register & state control unit 11. The chip enable & output enable control unit 13 receives the chip enable signal /CE and the output enable signal /OE, and, based on these signals, drives the input output buffer 12 or other decoding related units as adequate.

The timer 14 starts time counting in response to an instruction from the command register & state control unit 11 so that the command register & state control unit 11 can execute control operations by making state transitions according to the time thus counted.

The address latch 16 receives and latches address signals supplied from outside, and provides the address signals to the Y decoder 17 and the X decoder 18. The Y decoder 17 decodes the address data from the address latch 16, and provides the decoded address signals to the Y gate unit 19. Further, the decoder 18 decodes the address data provided from the address latch 16, and activates a word line of the cell array 20 according to decoded results.

The Y gate unit 19 connects a selected bit line of the cell array 20 to the sense amplifier & comparator unit 21, based on the decoded address signals supplied from the Y decoder 17. Thus, a read/write route to the cell array 20 is established.

The cell array 20 that stores data to each of its memory cells includes a memory cell array, word lines and bit lines. In data reading, data of memory cells indicated by the activated word line is provided to the Y gate unit 19. In a program or erase operation, appropriate voltages corresponding to the type of the operation are provided to the word lines and bit lines to execute charge injection to or charge removal from the memory cells.

The sense amplifier & comparator unit 21, checks whether data is 0 or 1 by comparing the voltage level of the data provided from the cell array 20 via the Y gate unit 19 with a reference level provided from the reference cell 22. The check result is provided to the input output buffer 12 as read out data. Further, a verify operation associated with program and erase operations is performed by comparing a level of the data provided from the cell array 20 via the Y gate unit 19 with a reference level of the reference cell 22.

The reference cell 22 includes memory cells for reference, which generate a reference level to be used in checking the data and provides the reference level to the sense amplifier & comparator unit 21.

The semiconductor memory device 10 to which the present invention is applied has a structure that allows simultaneous read and program or erase operations. The simultaneous operations can be realized by providing a plurality of banks where each bank is comprised of the address latch 16, the Y decoder 17, the X decoder 18, the Y gate unit 19, the cell array 20 and the sense amplifier & comparator unit 21. For example, while a read operation is conducted in a given bank, a program or erase operation can be performed in another bank so as to enable efficient read/write operations.

The present invention provides the dummy cell 23 in addition to the reference cell 22. In the verify operation associated with the program or erase operation, the sense amplifier & comparator unit 21 compares the data of the cell array 20 with the reference cell 22, and also compares dummy data of the dummy cell 23 with the reference cell 22. The dummy data of the dummy cell 23 is so set as to give a "fail" result in the verify operation under a normal condition where there is no power line noise.

Figure 2:
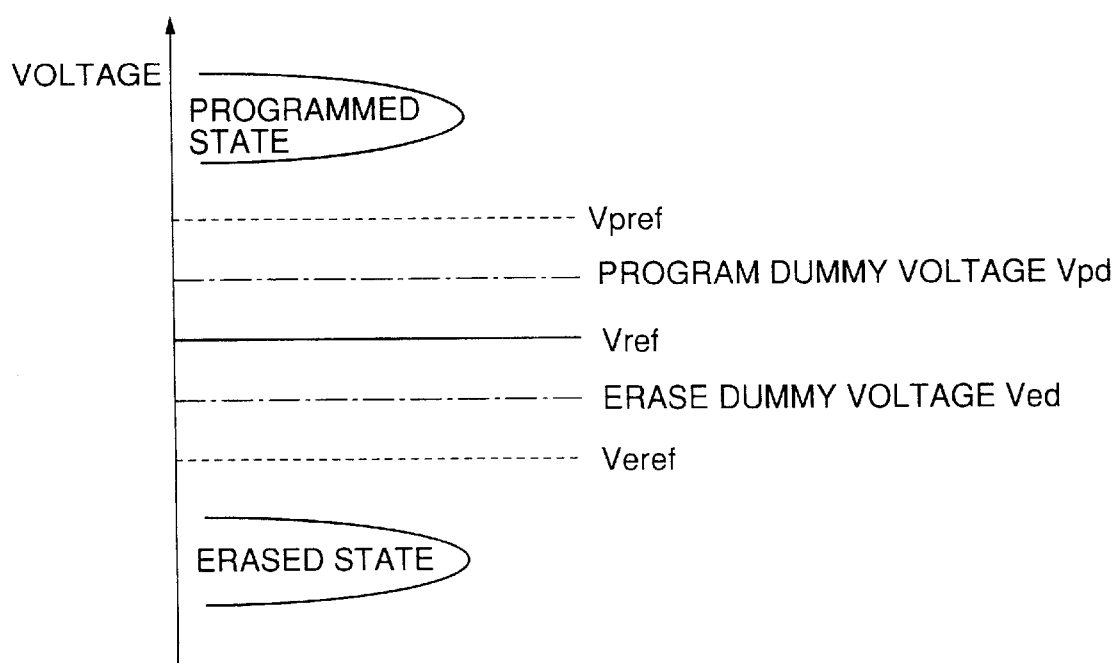
FIG. 2 explains voltage levels that a sense amplifier & comparator unit compares during verify and read operations.

FIG. 2 shows relative voltage levels that the sense amplifier & comparator unit compares in the verify and read operations.

The sense amplifier & comparator unit 21 conducts the verify operation by comparing data of a programmed memory cell in the cell array 20 with a reference voltage (base voltage) Vpref, as indicated by the upper dotted line, for program verification. If a voltage of the memory cell data is higher than the program verify reference voltage Vpref, then, it is determined that the memory cell has properly been programmed. If, on the contrary, the memory cell data level is lower than the program verify reference level Vpref, then the program operation and program verify operation are repeated until sufficient electric charges are stored in the memory cell. Thus, the memory cell as properly programmed shall have a voltage level generally falling within a range indicated as "programmed state" in FIG. 2.

In the erase operation, the sense amplifier & comparator unit 21 performs the verify operation by comparing an erase verification reference voltage (base voltage) Veref, indicated by the lower dotted line in FIG. 2, with the memory cell data in the cell array 20 which is supposedly erased. If the memory cell data shows a lower voltage than the erase verify reference voltage Veref, then it is determined that the memory cell has properly been erased. If, on the contrary, the memory cell data level is higher than the erase verify reference voltage Veref, then erase operations and erase verify operations are repeated until electric charges are properly removed from the memory cell. Thus, the memory cell data in the erase status shall have a voltage level generally falling within a range indicated as "erased state" shown in FIG. 2.

When a read operation takes place after the memory cell has been either programmed or erased as described above, the sense amplifier & comparator unit 21 compares data read from the cell array 20 with a read operation reference voltage Vref. If the read data level is higher than the reference level Vref, then it is determined that the cell is in a programmed status. If, on the contrary, the read data level is lower than the reference level Vref, then it is ascertained that the cell is in an erased status.

If the semiconductor memory device 10 is made of a plurality of banks and designed so as to allow simultaneous operations of reading and programming or erasing, the verify operation is subjected to a power supply voltage fluctuation caused by the read operation, resulting in an erroneous check result wherein data which should have failed passes. To cope with this problem, the present invention provides the dummy cell 23 which provides a program dummy voltage Vpd in program verify operations and an erase dummy voltage Ved in erase verify operations.

The program dummy voltage Vpd is set at a level lower than the program verify reference voltage Vpref as shown in FIG. 2. Thus, when the sense amplifier & comparator unit 21 compares the program dummy voltage Vpd with the reference voltage Vpref, a decision shall always be "fail" under a normal condition where no noise exists. Further, the erase dummy voltage Ved is set at a higher voltage level than the erase verify reference voltage Veref, as shown in FIG. 2. Thus, when the sense amplifier & comparator unit 21 compares the erase dummy voltage Ved with the reference voltage Veref, a decision shall always be "fail" in the absence of noise.

As described above, the present invention provides the dummy cell 23 which shall fail in the verify operation where there is no noise. If the data voltage fluctuates relative to the reference voltage due to power supply noise in the verify operation, then it may cause an erroneous determination to pass the data that should have failed. Here, however, both the data and dummy voltages fluctuate relative to the reference voltage, causing a "pass" determination for the data of the dummy cell 23. Accordingly, if the data of the dummy cell 23 passes the test, then a determination can be made that an erroneous operation has taken place due to power supply noise or the like.

Figure 3:
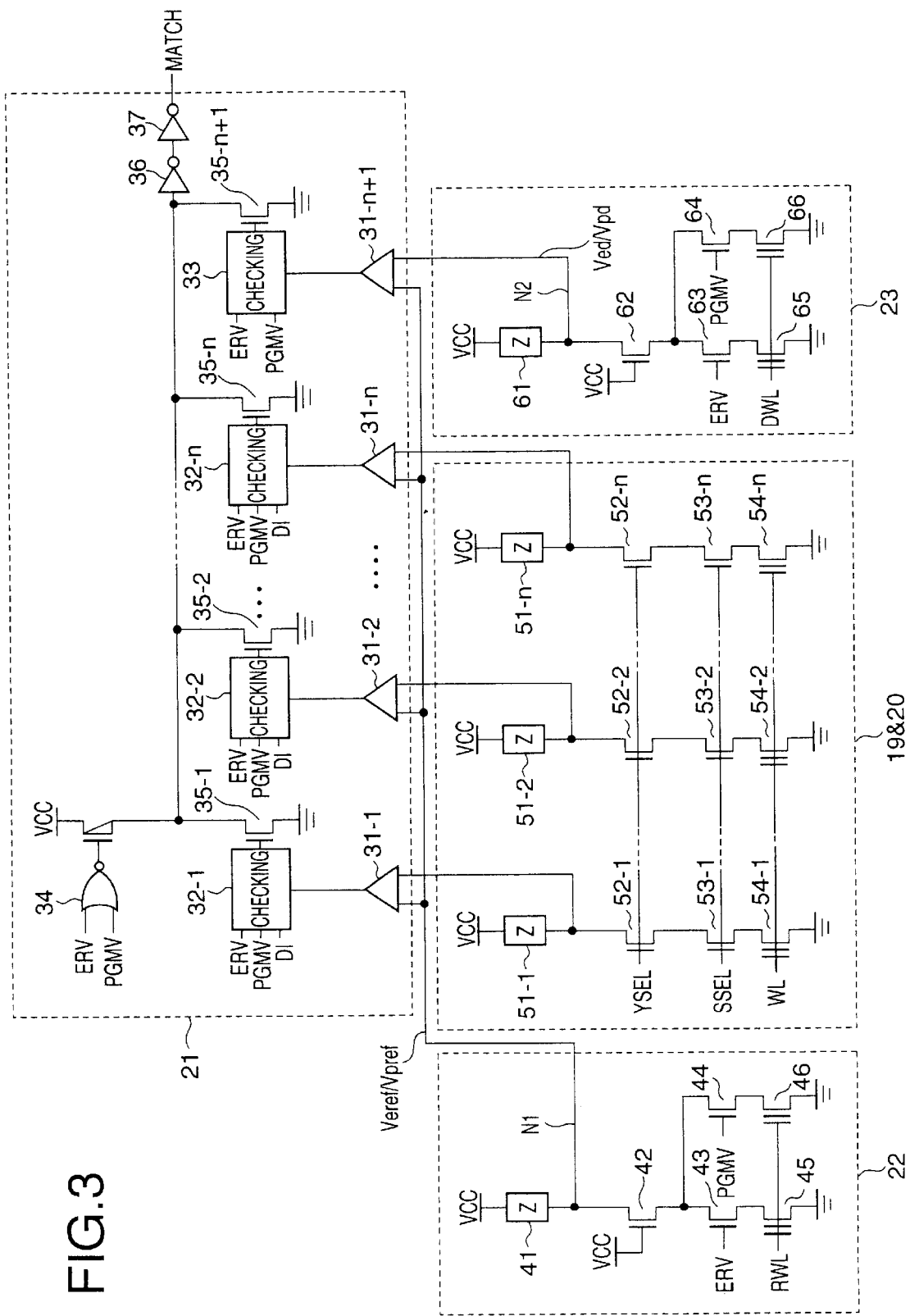
FIG. 3 is a circuit diagram of the sense amplifier & comparator unit, a dummy cell unit and its peripheral units.

FIG. 3 is a circuit diagram of the sense amplifier & comparator unit 21, a dummy cell unit 23 and its peripheral units.

The sense amplifier & comparator unit 21 includes sense amplifiers 31-1 through 31-n+1, checking units 32-1 through 32-n, a checking unit 33, a NOR circuit 34, NMOS transistors 35-1 through 35-n+1 and inverters 36 and 37.

Further, the reference cell 22 includes a load 41, NMOS transistors 42 through 44 and memory cell transistors 45 and 46. A driving voltage VCC, an erase instruction signal ERV and a program instruction signal PGMV are applied to gates of the NMOS transistors 42 through 44, respectively. The erase instruction signal ERV and the program instruction signal PGMV which are provided by the command register & state control unit 11, are set at HIGH in erase operations and program operations, respectively. A signal RWL supplied to the gate of the memory cell transistors 45 and 46 is set such that a voltage of a node N1 becomes the erase verify reference voltage Veref in erase operations and the program verify reference voltage Vpref in program operations. The voltage of the node N1 is provided to the sense amplifier & comparator unit 21.

The Y gate unit 19 and the cell array 20 include loads 51-1 through 51-n, NMOS transistors 52-i through 52-n, NMOS transistors 53-1 through 53-n, and memory transistors 54-1 through 54-n. The NMOS transistors 52-1 through 52-n and the NMOS transistors 53-1 through 53-n belong to the Y gate unit 19. Gates of these transistors receive selection signals YSEL and SSEL which are based upon a column address. Gates of the memory cell transistors 54-1 through 54-n receive a signal on the word line WL. When the word line is activated for selection, data in each of the memory cell transistors are supplied to the sense amplifier & comparator unit 21.

The dummy cell 23 includes a load 61, NMOS transistors 62 through 64 and memory cell transistors 65 and 66. Gates of the NMOS transistors 62, 63 and 64 receive the driving voltage VCC, the erase instruction signal ERV and the program instruction signal PGMV, respectively. Accordingly, the NMOS transistor 63 becomes conductive in the erase operation and the NOMOS transistor 64 becomes conductive in the program operation. A signal DWL that is supplied to the gates of the memory cell transistors 65 and 66 is set such as to cause a voltage of a node N2 to be the erase dummy voltage Ved in the erase operation and to be the program dummy voltage Vpd in the program operation. The voltage of the node N2 is provided to the sense amplifier & comparator unit 21.

In the following, the erase operation will be described in detail. In the erase operation, the signals ERV and PGMV are set at HIGH and LOW, respectively. The signal DI is irrelevant in the erase operation.

The sense amplifiers 31-1 through 31-n in the sense amplifier unit 21 compare the erase verify reference voltage Veref supplied from the reference cell 22 with voltages corresponding to data in the memory cells 54-1 through 54-n of the cell array 20, which are to be erased. At initial stages of the erase operation, electric charges may not be sufficiently removed, therefore, the voltages from the cell array 20 may be higher than the reference voltage Veref. Accordingly, the sense amplifiers 31-1 through 31-n may output LOW. The LOW signals are provided to the checking units 32-1 through 32-n. If the signals ERV and PGMV are HIGH and LOW, respectively, then the checking units 32-1 through 32-n output LOW when signals from the sense amplifiers are HIGH. On the other hand, they output HIGH when the output of the sense amplifiers are LOW. Accordingly, in this case (where the electric charges have not been sufficiently removed in the early stages of the erase operation), the checking units 32-1 through 32-n output HIGH. As a result, an output signal MATCH of the sense amplifier & comparator unit 21 is LOW, indicating that the verify operation has been determined as "fail". The output signal MATCH is provided to the command register & state control unit 11, as shown in FIG. 1.

Upon the verify operation detecting the failure, the erase operation is repeated, with a subsequent verify operation to follow. As the erase operation proceeds to further remove electric charges in the memory cells, the voltages received from the cell array 20 become lower than the reference voltage Veref, causing the outputs of the sense amplifiers 31-1 through 31-n to become HIGH. Then, the outputs of the checking units 32-1 through 32-n become LOW, making the transistors 35-1 through 35-n nonconductive.

Further, the sense amplifier 31-n+1 receives the erase dummy voltage Ved from the dummy cell 23 as well as the erase verify reference voltage Veref from the reference cell 22. As shown in FIG. 2., the erase dummy voltage Ved is set higher than the erase verify reference voltage Veref. Accordingly, the sense amplifier 31-n+1 outputs LOW. The checking unit 33 is so designed as to output LOW if the output of the sense amplifier is LOW and to output HIGH if the output of the sense amplifier is HIGH, while the signals ERV and PGMV are HIGH and LOW, respectively, contrary to the checking units 32-1 through 32-n.

Figure 4:
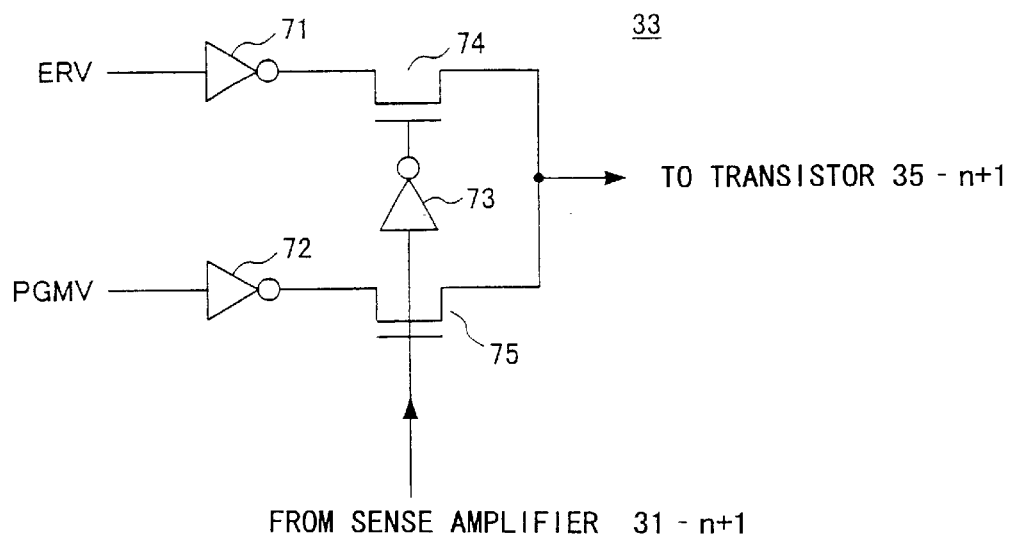
FIG. 4 is a circuit diagram of a checking unit which is connected to the dummy cell.

FIG. 4 is a circuit diagram of a checking unit 33 which is connected to the dummy cell 23.

The checking unit 33 includes inverters 71 through 73 and NMOS transistors 74 and 75. As is evident from FIG. 4, an output of this unit 33 is an inverse of the signal ERV when the sense amplifier 31-n+1 outputs LOW and is an inverse of PGMV if the sense amplifier 31-n+1 outputs HIGH.

Accordingly, in the above case, the checking unit 33 outputs LOW, by which the transistor 35-n+1 becomes nonconductive.

As described above, all of the transistors 35-1 through 35-n+1 become nonconductive when the erase operation has proceeded sufficiently. At that time, the output signal MATCH of the sense amplifier & comparator unit 21 becomes HIGH, indicating that the verify operation has passed. The output signal MATCH is supplied to the command register & state control unit 11, as shown in FIG. 1.

If a voltage relationship between the voltage Veref of the reference cell 22 and a voltage that corresponds to the memory cells 54-1 through 54-n in the cell array 20, which are to be erased, is reversed due to noise on the power line or the like during the early stages of the erase operation (when erasing has not been sufficient), then an erase verify check result in a conventional circuit will give a "pass" result. In the present invention, the relationship between the erase dummy voltage Ved of the dummy cell 23 and the reference voltage Veref of the reference cell 22 will also be reversed in this case. Accordingly, the sense amplifier 31-n+1 will output HIGH and the checking unit 33 will also output HIGH. As a result, the output signal MATCH of the sense amplifier & comparator unit 21 will be LOW, indicating that the verification has found an erase failure. Thus, the present invention can avoid a situation in which an insufficient erase status passes the erase verification test due to the noise or the like.

The program operation will be described next. The signals ERV and PGMV are LOW and HIGH, respectively, in the program operation. As an example, only the memory cell 54-2 is targeted for the programming among the memory cells 54-1 through 54-n in the cell array 20. The signal DI is set equal to LOW only with respect to the checking unit 32-2, and is set to HIGH with respect to other checking units.

Figure 5:
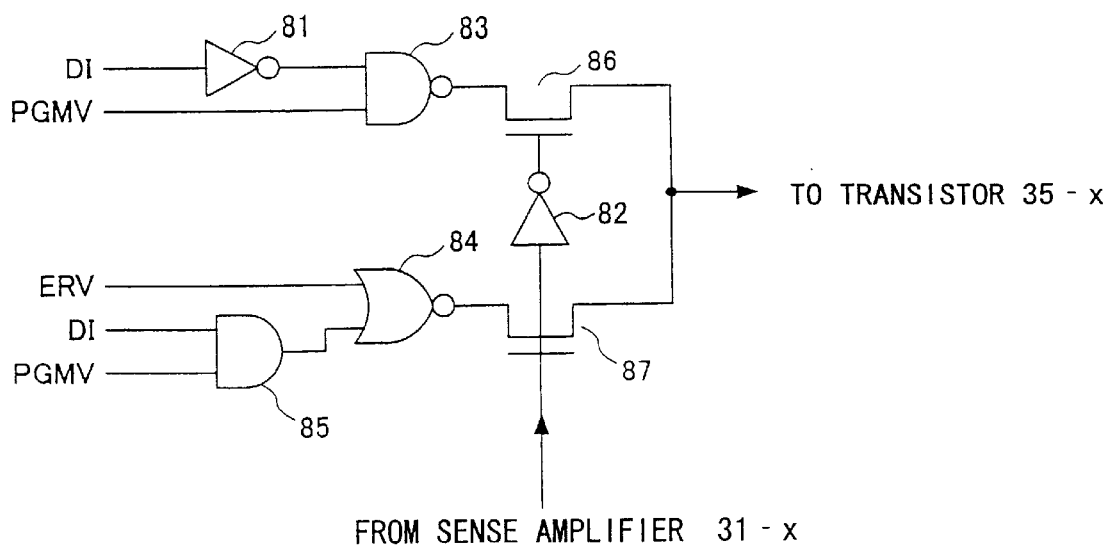
FIG. 5 is a circuit diagram of a checking unit which is connected to a memory cell.

FIG. 5 is a circuit diagram of a checking unit. The checking units 32-1 through 32-n have the same circuit configuration as shown in FIG.5. The checking unit in FIG. 5 includes inverters 81 and 82, a NAND circuit 83, a NOR circuit 84, an AND circuit 85 and NMOS transistors 86 and 87.

As previously described, the signals ERV and PGMV are HIGH and LOW, respectively, in the erase operation. The output of the checking units is LOW if the signal from the sense amplifier is HIGH and vice versa, irrelevant of the status of the signal DI.

In the program operation, the signals ERV and PGMV are LOW and HIGH, respectively. The signal DI is LOW for a memory cell to which the programming is targeted and is HIGH for memory cells to which the programming is not targeted (electric charges not injected). Accordingly, the NAND circuit 83 will output LOW and the NOR circuit 84 will output HIGH for the targeted memory cell. In this case, the checking unit will output HIGH if the sense amplifier outputs HIGH, and will output LOW if the sense amplifier outputs LOW. For other memory cells that are not targeted for the programming, the NAND circuit 83 outputs HIGH and the NOR circuit 84 outputs LOW. For these untargeted memory cells, the checking units output LOW if the output of the sense amplifier is HIGH and output HIGH if the output of the sense amplifier is LOW.

With reference to FIG. 3 again, the sense amplifiers 31-1 through 31-n of the sense amplifier & comparator unit 21 compare voltages corresponding to the data in the memory cells 54-1 through 54-n of the cell array 20 with the program verify reference voltage Vpref. In initial stages of programming when electric charges may have been injected insufficiently, the voltage of the targeted memory cell 54-2 may be lower than the reference voltage Vpref. Accordingly, the sense amplifier 31-2 outputs HIGH. The HIGH signal is provided to the checking unit 32-2, to output HIGH. Consequently, the output signal MATCH of the sense amplifier & comparator unit 21 is LOW, showing that the verify operation has found a program failure.

The program operation is repeated subsequent to the decision of the failure in previous programming, with a further verification operation following. As the programming operations are repeated, the voltage corresponding to the memory cell 52-2 as received from the cell array 20 will become higher than the reference voltage Vpref, which causes the sense amplifier 31-2 to output LOW. As a result, the checking unit 32-2 outputs LOW to make the transistor 35-2 nonconductive.

Further, voltages of the non-targeted memory cells (in erased status) in the cell array 20 are lower than the reference voltage Vpref. Consequently, the associated sense amplifiers, i.e., those other than the sense amplifier 31-2, output HIGH. With the DI signal set at HIGH for the checking units for these sense amplifiers, the checking units output LOW as they receive HIGH from these sense amplifiers.

As a result, all transistors 35-1 through 35-n become nonconductive.

Further, the sense amplifier 31-n+1 receives the program dummy voltage Vpd from the dummy cell 23 and the program verify reference voltage Vpref from the reference cell 22. As shown in FIG. 2, the program dummy voltage Vpd is lower than the program verify reference voltage Vpref, therefore, the sense amplifier 31-n+1 outputs HIGH. The checking unit 33 outputs HIGH if the signal from the sense amplifier is LOW, and vice versa, while the signals ERV and PGMV are LOW and HIGH, respectively. Accordingly, the checking unit 33 outputs LOW in this case, which makes the transistor 35-n+1 nonconductive.

As described above, when the program operation has sufficiently proceeded, all transistors 35-1 through 35-n+1 become nonconductive. Then, the output signal MATCH of the sense amplifier & comparator unit 21 becomes HIGH, indicating that the verify operation passes the test. The output signal MATCH is provided to the command register & state control unit 11, as shown in FIG. 1.

There may be a case in which relative levels of the voltage of the targeted memory cell 54-2 of the cell array 20 and the reference voltage Vpref of the reference cell 22 are reversed in early stages of the program operation (while the programming has not been sufficient) due to a noise on the power supply line or for other reasons. In this event, a conventional circuit provides an erroneous determination by giving a "pass" result in a program verify operation. In the present invention, the relationship between the program dummy voltage Vpd from the dummy cell 23 and the reference voltage Vpref of the reference cell 22 is also reversed. Thus, the sense amplifier 31-n+1 outputs LOW and the checking unit 33 outputs HIGH. Consequently, the transistor 35-n+1 becomes conductive. As a result, the output signal MATCH of the sense amplifier & comparator unit 21 becomes LOW, indicating that the verify operation has found a failure. Thus, the present invention prevents an erroneous "pass" decision caused by the power line noise or the like while the programming has not been sufficient.

Figure 6:
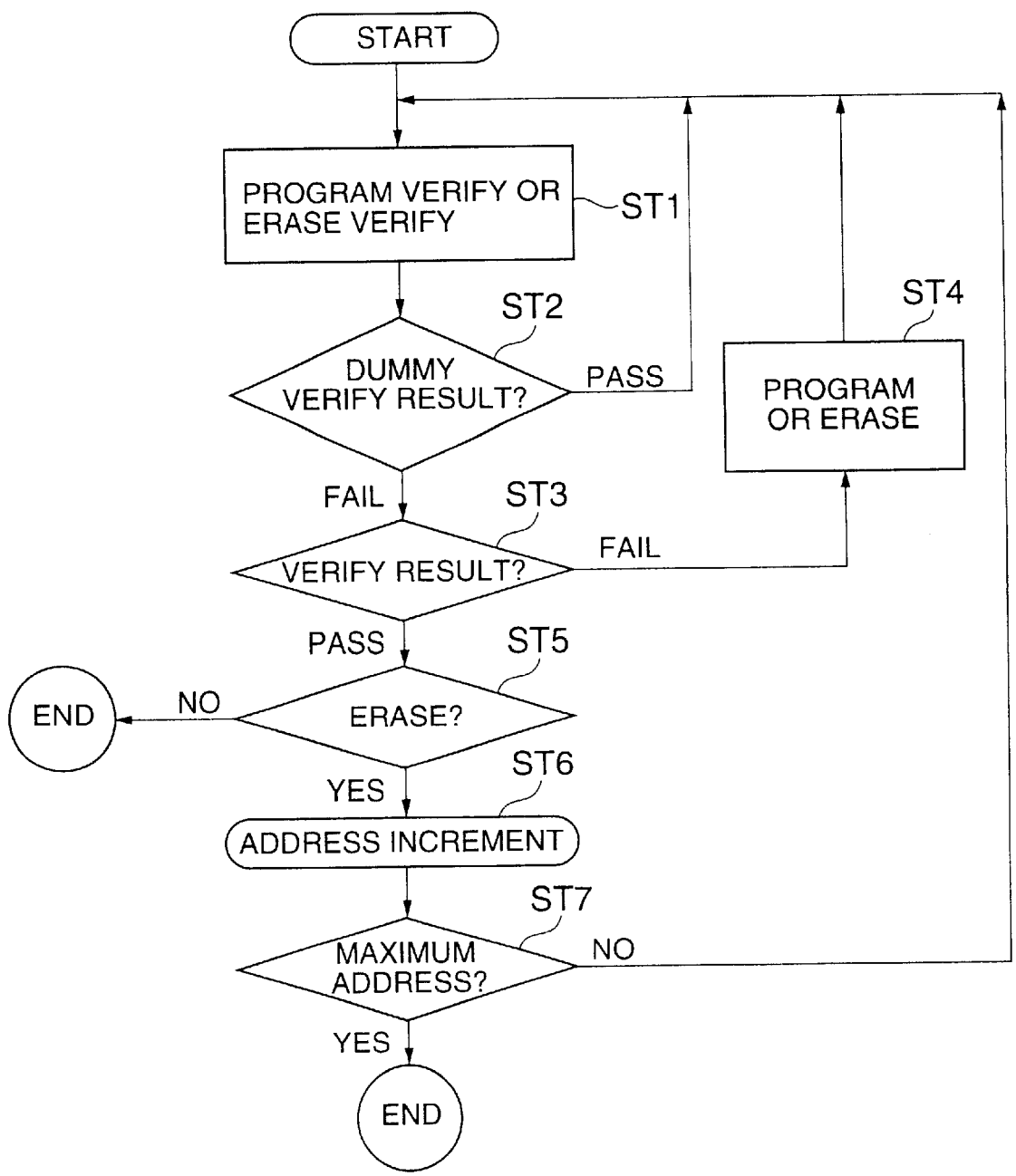
FIG. 6 is a flow chart of a program or erase operation process.

FIG. 6 is a flow chart of a program or erase operation process in the present invention.

In a step ST1, a program verify operation or an erase verify operation is executed.

In a step ST2, a dummy verify result is checked. If the result is a "pass", the process returns to the step ST1 to repeat the program verify operation or the erase verify operation. That is, if the dummy verify result is a "pass", a determination is made that an adverse effect of power line noise or the like might have happened. Further processes do not take place until the noise is removed. If the dummy verify result is a "fail", then the process advances to a step ST3.

In the step ST3, verify results of ordinary memory cells, other than the dummy cell, are checked. If the results are "pass", then the process proceeds to a step ST5. If the verify results are "fail", then the process goes to a step ST4 in which the program or erase operation is executed and then, proceeds to the step ST1 to repeat the program or erase verify operation.

A step ST5 checks whether the present operation is the program operation or the erase operation. If it is the program operation, the process ends. If it is the erase operation, the process goes to a step ST6. In the step ST6, an address of a targeted memory is incremented by one.

In a step ST7, a decision is made whether or not the current address is the maximum address. If the current address is the maximum address, then the process ends, otherwise the process returns to the step ST1 to repeat the subsequent steps.

FIG. 6 represents an example of the program or erase operation process where the dummy verify result is checked independently of an ordinary verify result. To the contrary, FIG. 3 has represented an example where the dummy verify result is combined with the verify results of ordinary memory cells to obtain one verify result as the signal MATCH which is provided to the command register & state control unit 11.

In the structure of FIG. 3, if the verify result fails, whether by the power line noise or any other causes, the program or erase operation is repeated, followed by the verify operation. In contrast, the example of FIG. 6 examines the dummy verify result independently, which allows to detect the power line noise or the like independently. Consequently, the program or erase operation is not repeated until the noise or the like is removed, realizing an efficient process.

In order to realize the process shown in FIG. 6, the output of the checking unit 33 of FIG. 3 is made available separately from the checking results of other checking units for the memory cells.

Figure 7:
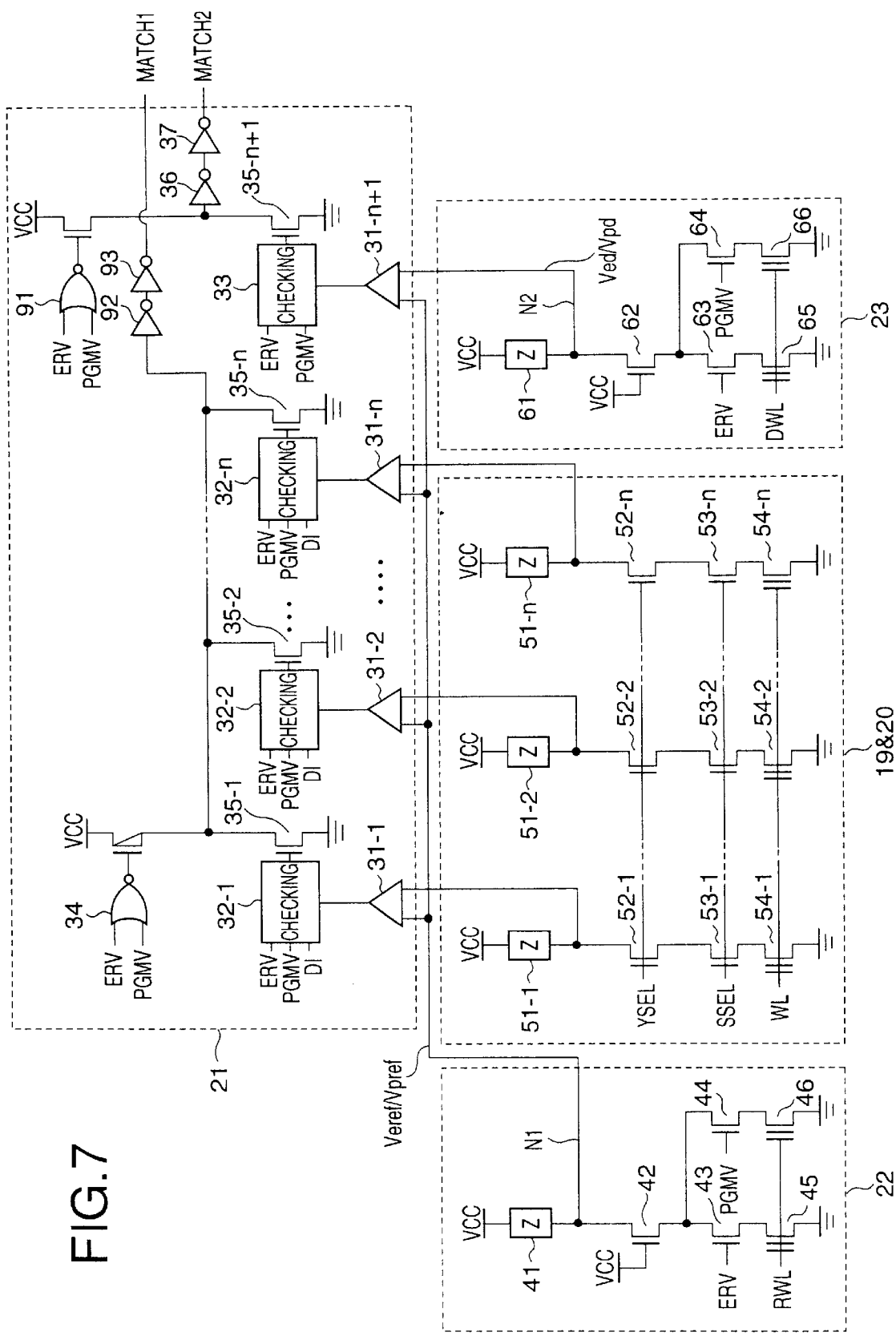
FIG. 7 is a circuit diagram that shows a structure to detect a dummy verify result independently from verify results of other memory cells.

FIG. 7 is a circuit diagram that shows a structure to detect a dummy verify result independently from the checking results of other memory cells. In FIG. 7, the same elements as shown in FIG. 3 are referenced by the same reference numbers, and descriptions of such elements are omitted.

In FIG. 7, a NOR circuit 91 and inverters 92 and 93 are provided to output a verify result of the ordinary memory cells as an output signal MATCH1, while the verify result of the dummy cell is output as an output signal MATCH2. Thus, the verify result for the ordinary memory cells and the verify result for the dummy cell can separately be supplied to the command register & state control unit 11. The command register & state control unit 11 determines that there is a power line noise or another irregularity when the signal MATCH2 is LOW.

In the above example of the embodiment, the semiconductor memory device 10 has been assumed to be capable of performing the read operation and the program or erase operation simultaneously. The assumption is not a necessary condition to apply the present invention. The present invention can be effectively applied to a semiconductor memory device which executes a read operation and a program or erase operation not simultaneously so long that a verify operation is subjected to a power line noise or other irregularities causing an adverse affect to the verify operation.

In the above example, the verify operation is conducted by comparing voltages. Alternatively, the verify operation may be performed by comparing electrical currents.

The present invention has been explained as above with reference to embodiments. However, the present invention is not limited to these embodiments, but variations and modifications may be made without departing from the scope of the present invention.

The present application is based on Japanese priority application No. 2000-331343 filed on Oct. 30, 2000 with the Japanese Patent Office, the entire contents of which are hereby incorporated by reference.

What is claimed is:

1. A semiconductor memory device which includes
a memory cell,
a comparator unit that detects whether a first level corresponding to a memory status of said memory cell is set within a predetermined range based on comparison of the first level with a reference level; and
a dummy cell that provides a second level which is set to such a level that said comparator unit determines the second level as falling outside said predetermined range when comparing the second level with said reference level.

2. The semiconductor memory device as claimed in claim 1, further comprising a control unit that detects an irregularity of an operation when said comparator unit determines that said second level falls within said predetermined range based on the comparison of the second level with said reference level.

3. The semiconductor memory device as claimed in claim 1, further comprising a control unit that determines that said first level is correctly set within said predetermined range when said comparator unit determines that said second level is outside said predetermined range and that said first level is set within said predetermined range.

4. The semiconductor memory device as claimed in claim 1, further comprising a control unit which determines that said first level is not correctly set within said predetermined range when said comparator unit determines that said second level is set within said predetermined range and that said first level is set within said predetermined range.

5. The semiconductor memory device as claimed in claim 1, wherein said memory cell includes a memory cell transistor for a flash memory that has a programmed state and an erased state as memory states thereof.

6. The semiconductor memory device as claimed in claim 5, wherein two levels are provided as said reference level, and two levels are provided as said second level, each of the two levels corresponding to said programmed state and said erased state, respectively.

7. A semiconductor memory device, comprising:
a comparator unit which verifies a programmed state and an erased state of a memory cell; and
a dummy cell which is verified by said comparator unit in a manner identical to the verification of the memory cell, and is set to such a level as to produce a fail result as a result of verification.

8. The semiconductor memory device as claimed in claim 7, further comprising a control unit which determines that an irregularity exists when said comparator unit finds a "pass" status as a verify result for said dummy cell.

9. The semiconductor memory device as claimed in claim 7, further comprising a control circuit which determines that said memory cell is correctly set at said programmed state or said erased state when said comparator unit determines that said dummy cell fails in a verification and said memory cell passes a verification.

10. The semiconductor memory device as claimed in claim 7, further comprising a plurality of banks, one of which is read while another is either programmed or erased.

11. A semiconductor memory device, comprising:
a memory cell;
a comparator unit which detects whether a first level corresponding to a memory status of said memory cell is set within a predetermined range based on comparison of the first level with a reference level; and
a dummy cell that supplies to said comparator unit a second level which is fixedly set to a level that said comparator unit determines as falling outside said predetermined range when comparing the second level with said reference level.

12. A semiconductor device comprising:

a memory cell;

a reference cell which provides a reference level;

a comparator unit which detects whether a first level corresponding to a memory status of said memory cell is set within a predetermined range based on comparison of the first level with the reference level of said reference cell; and a dummy cell that provides a second level that the comparator unit determines that the second level as failing outside the predetermined range when comparing the second level with the reference level.

* * * * *